(12) United States Patent
Caimi et al.

(10) Patent No.: US 9,136,416 B2
(45) Date of Patent: Sep. 15, 2015

(54) SOLAR LIGHT CONCENTRATION PHOTOVOLTAIC CONVERSION SYSTEM USING A WAVELENGTH SPLITTER AND LAMBDA-SPECIFIC PHOTOVOLTAIC CELLS OPTICALLY COUPLED TO LAMBDA-DEDICATED FIBERS ILLUMINATED BY RESPECTIVE SPLIT BEAMS

(71) Applicant: STMicroelectronics S.r.l., Agrate Brianza (IT)

(72) Inventors: Carlo Caimi, Cinisello Balsamo (IT); Ubaldo Mastromatteo, Bareggio (IT); StefanoAntonio Mastrorosa, Milan (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 297 days.

(21) Appl. No.: 13/707,747

(22) Filed: Dec. 7, 2012

(65) Prior Publication Data

US 2013/0146121 A1  Jun. 13, 2013

(30) Foreign Application Priority Data

Dec. 13, 2011  (IT) .............................. MI2011A2247

(51) Int. Cl.
*H01L 31/054* (2014.01)
*H01L 31/0236* (2006.01)
(Continued)

(52) U.S. Cl.
CPC ...... *H01L 31/0528* (2013.01); *H01L 31/02327* (2013.01); *H01L 31/02363* (2013.01);
(Continued)

(58) Field of Classification Search
CPC .............. G02B 6/4204; H01L 31/0543; H01L 31/0547; H01L 31/02327; H01L 31/054; H01L 31/056; H01L 31/0549; Y02B 10/12; Y02E 10/52; H02S 40/22
See application file for complete search history.

(56) References Cited

U.S. PATENT DOCUMENTS 4,162,928 A * 7/1979 Frosch et al. .................. 136/246
5,089,055 A * 2/1992 Nakamura ..................... 136/248
(Continued)

FOREIGN PATENT DOCUMENTS

JP     2224375 A     9/1990

OTHER PUBLICATIONS

Ortabasi, "Dish/photovoltaic cavity converter (PVCC) system for ultimate solar-to-electricty conversion efficiency-general concept and first performance predictions," IEEE, 2002, p. 1616-1620.*
(Continued)

*Primary Examiner* — Marla D McConnell
(74) *Attorney, Agent, or Firm* — Allen, Dyer, Doppelt, Milbrath & Gilchrist, P.A.

(57) ABSTRACT

A solar light concentration photovoltaic conversion system, uses a solar light collector to focus collected light onto a termination of at least one multi-fiber cable. A wavelength splitter is optically coupled to the other termination of the multi-fiber cable for producing light beams of different wavelengths, each illuminating the optical termination of one or more lambda-dedicated tap fibers or multi-fiber cables. From the wavelength splitter depart a number of lambda-dedicated groups of tap fibers adapted to convey the radiation to remotely arranged lambda-specific photovoltaic cells, configured for efficiently converting light energy of the specific wavelength spectrum carried along respective fiber or group of fibers into electrical energy. The lambda-specific photovoltaic cells are formed onto light spreading structures optically coupled to a respective tap fiber or multi-fiber cable, adapted to trap the injected light and convert it into electricity.

4 Claims, 9 Drawing Sheets

(51) Int. Cl.
*H01L 31/052* (2014.01)
*H01L 31/056* (2014.01)
*H01L 31/0232* (2014.01)
*H02S 40/22* (2014.01)
*G02B 6/42* (2006.01)

(52) U.S. Cl.
CPC ............ *H01L31/054* (2014.12); *H01L 31/056* (2014.12); *H01L 31/0543* (2014.12); *H01L 31/0547* (2014.12); *H01L 31/0549* (2014.12); *G02B 6/4204* (2013.01); *H02S 40/22* (2014.12); *Y02E 10/52* (2013.01); *Y10T 29/49117* (2015.01)

(56) References Cited

U.S. PATENT DOCUMENTS

| 5,291,331 | A | * | 3/1994 | Miano et al. | 359/598 |
| 2003/0213514 | A1 | | 11/2003 | Ortabasi | |
| 2009/0272424 | A1 | * | 11/2009 | Ortabasi | 136/246 |

OTHER PUBLICATIONS

D. Silva et al. "Optical System for Indoor Operation of High Concentration Cells," 20th European Photovoltaic Solar Energyconference. Proceedings of the 20th International Conference. WIP-renewable Energies; Jun. 6, 2005. XP040511826; ISBN: 978-3-936338-19-5, figures 1-3.

* cited by examiner

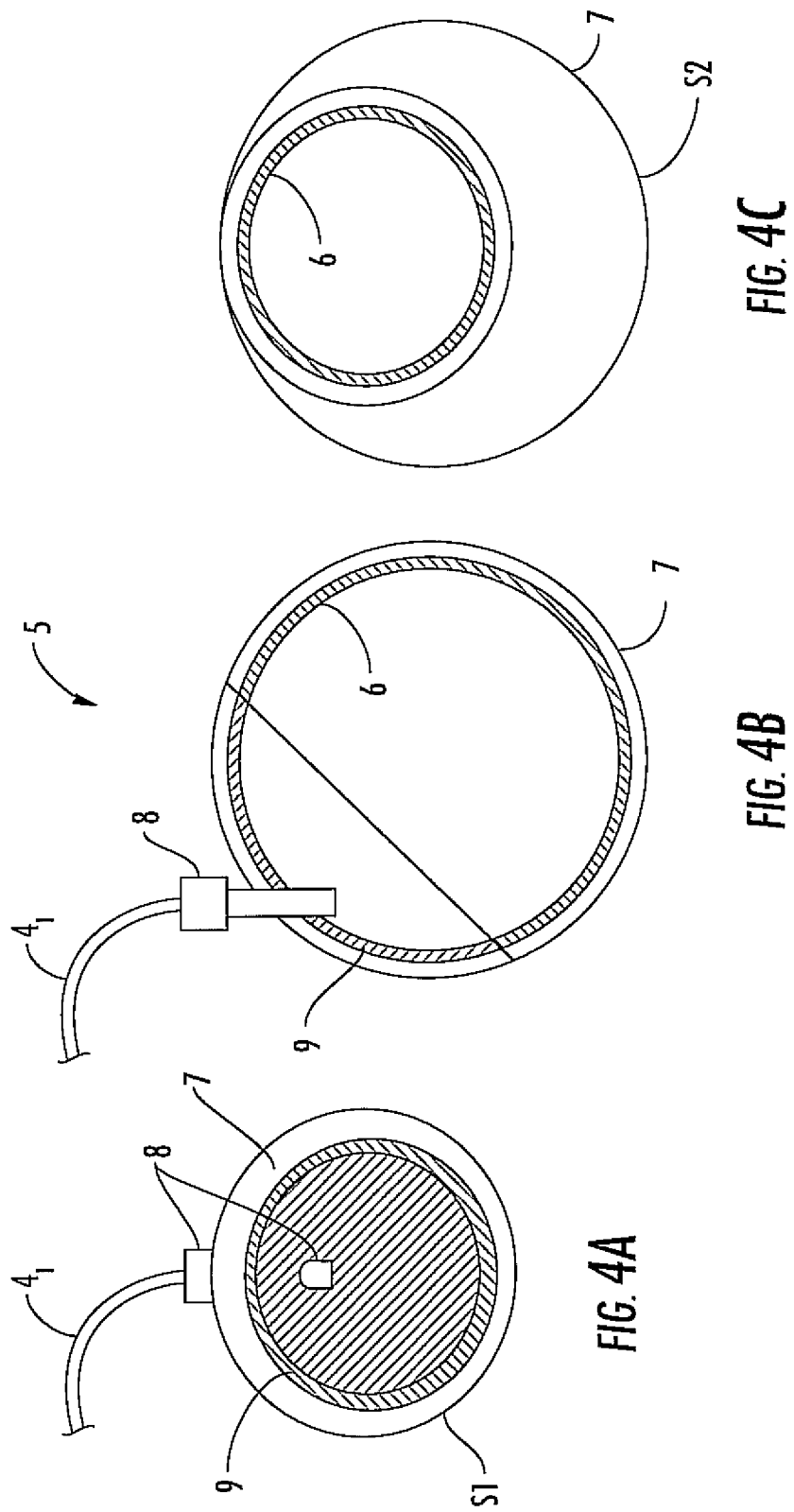

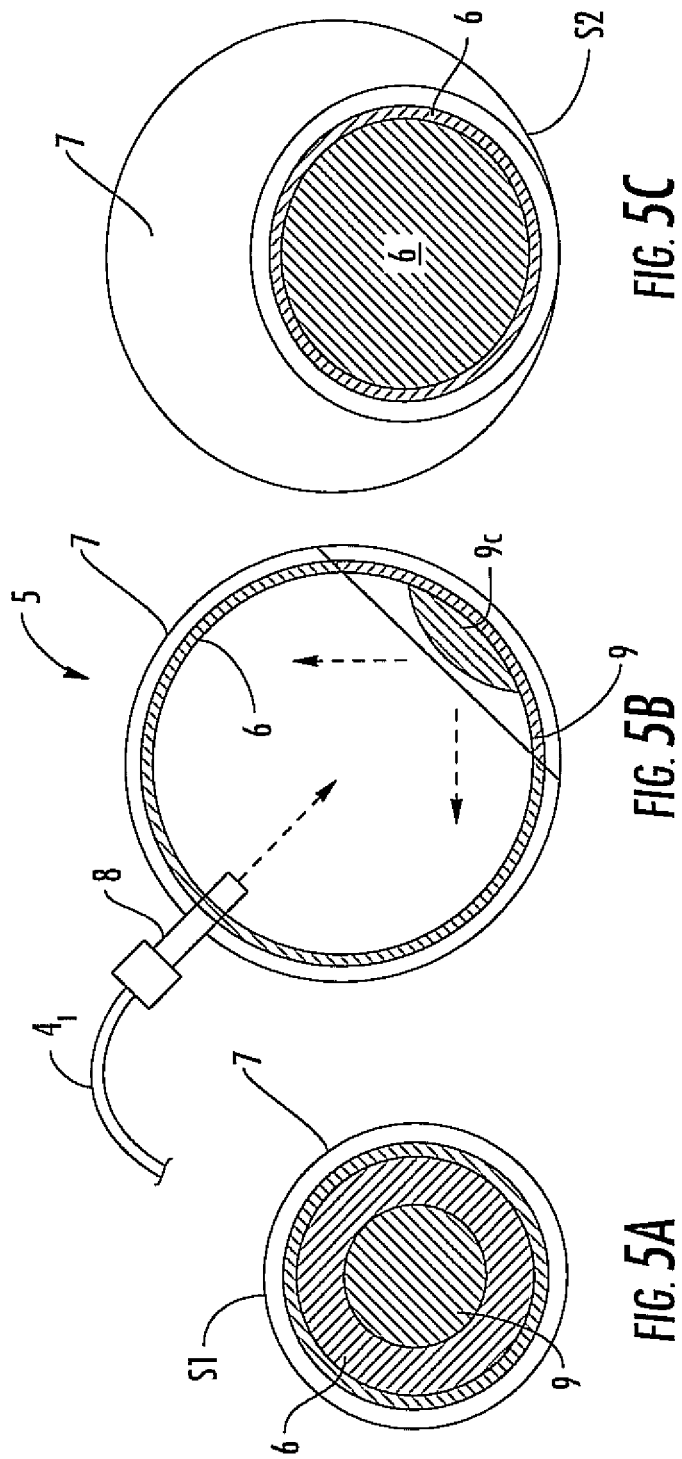

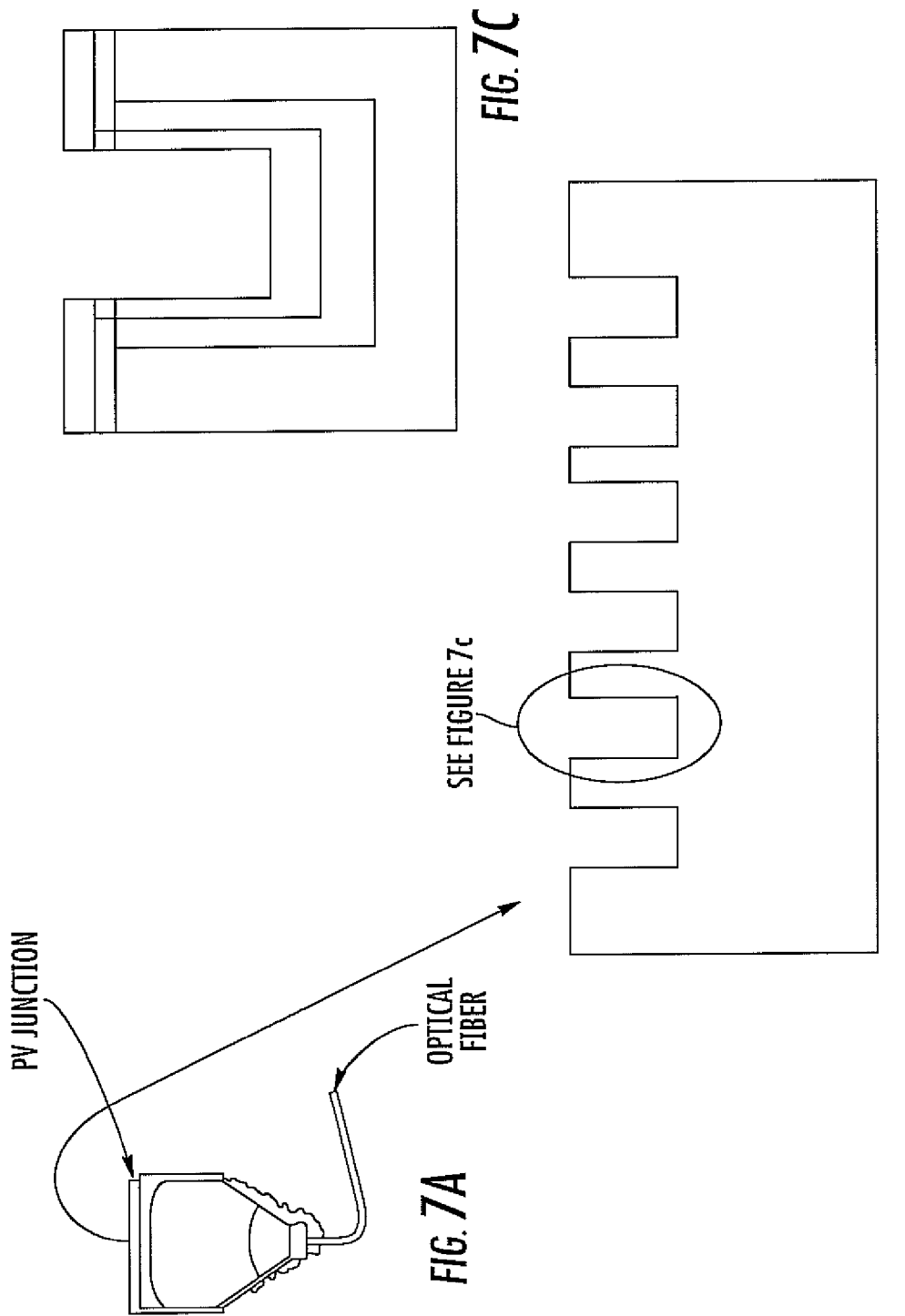

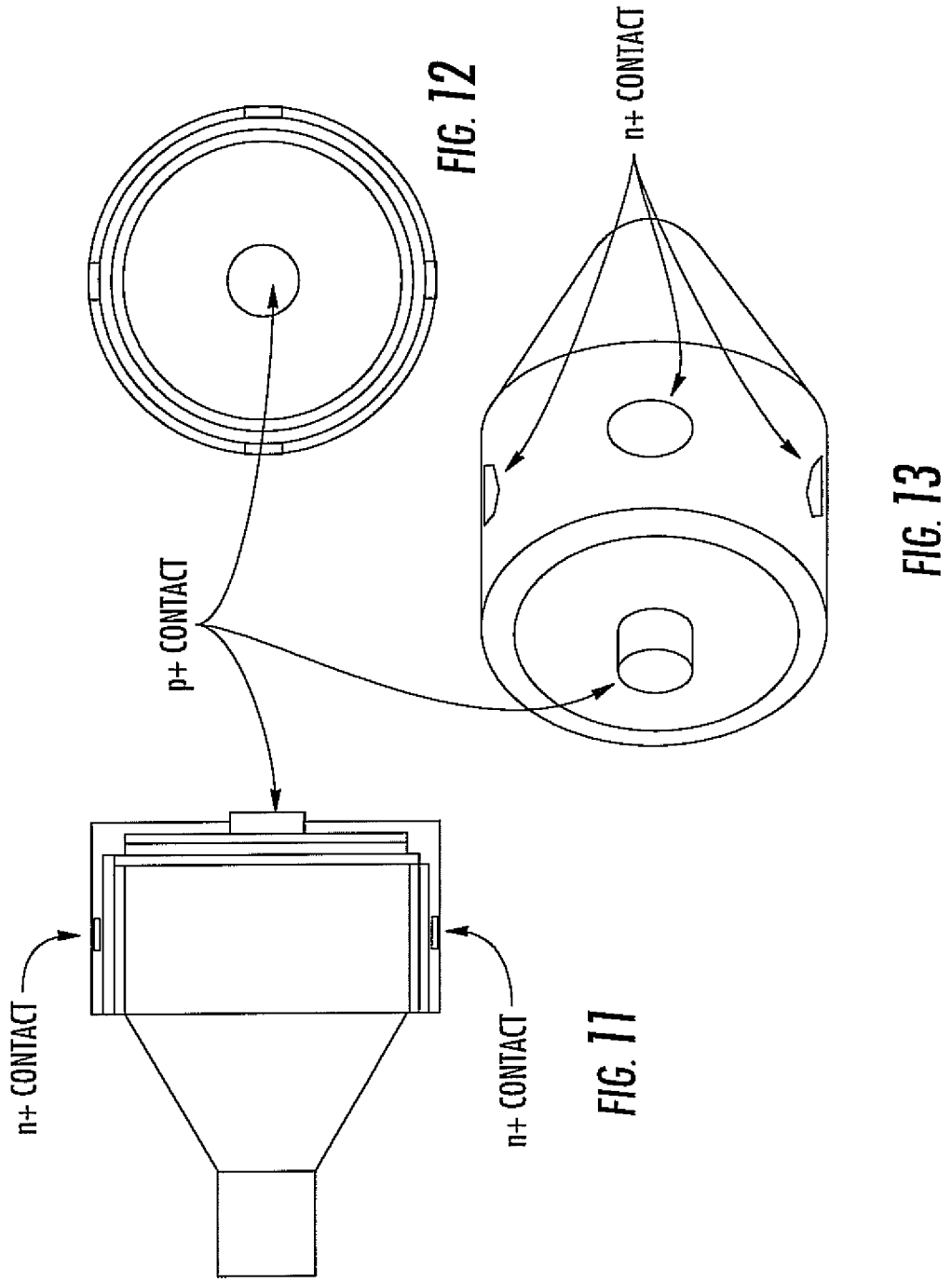

SOLAR LIGHT CONCENTRATION PHOTOVOLTAIC CONVERSION SYSTEM USING A WAVELENGTH SPLITTER AND LAMBDA-SPECIFIC PHOTOVOLTAIC CELLS OPTICALLY COUPLED TO LAMBDA-DEDICATED FIBERS ILLUMINATED BY RESPECTIVE SPLIT BEAMS

FIELD OF THE INVENTION

The present invention relates generally to solar light concentration photovoltaic conversion systems and related photovoltaic cell structures. In particular, this disclosure relates to photovoltaic systems using wavelength splitting of a primary light beam and lambda-specific photovoltaic cells.

BACKGROUND OF THE INVENTION

Normal operating conditions of photovoltaic (PV) conversion systems are rarely optimal. Depending on geographical location, season, and time of the day, sunshine conditions, partly or fully forecast skies will from time to time prevail. The spectrum of incident light differs considerably as a function of longitude and time of the day, from AM 1 to about AM 10. Under sunshine conditions, the operating temperature of a photovoltaic module, more so in hot climates or seasons, may be much higher than 25° C., set as the standard reference operating temperature, reaching values as high as 60° C. and even 80° C. This considerably lowers conversion efficiency of the cells, the open circuit voltage and to a lesser extent also the fill factor depends on the temperature of operation. These behaviors are parameterized by defining temperature coefficients $dV_{oc}/dT$ and $dFF/dT$, respectively. These coefficients differ for different photovoltaic active materials, though in general they are negative. By contrast, a relatively small positive temperature coefficient $dJ_{sc}/dT$ of the short circuit current may be exhibited by most of the common materials used for the cells.

FIG. 1 shows typical I-V characteristics of a 15×15 cm² crystalline silicon solar cell measured at STC, with indications of the performance parameter values. In particular, the so-called "fill factor" (FF) is a measure of the squareness of the I-V characteristics and is defined as $FF=V_{mpp}I_{mpp}/V_{oc}I_{sc}$, and, in the shown sample is equal to 0.7111, that is to say that 71.11% of the area subtended by the characteristic curve from $(0,0)$ to $(V_{oc}, I_{sc})$ is filled.

State-of-the-art, silicon based, photovoltaic panels normally reach an efficiency of about 15%.

An approach to increasing conversion efficiency is to use optical concentrators of the solar light, often associated with wavelength light splitters. These are for illuminating with the split beams, at each of the wavelengths in a specific region of the solar spectrum, "lambda-specific" photovoltaic cells made of active photovoltaic material most adapted to the specific range of wavelengths of the split beams.

Generally, this known class of light concentration photovoltaic cell systems assumes a relatively compact architecture because of the focusing of collected solar light, and with wavelength splitting and illumination with the split beams for distinct arrays of photovoltaic cells made with materials optimized for the specific wavelength range (lambda-specific).

Compactness, for reducing the length of light distribution paths to typically high power rating, highly efficient lambda-specific cells, and the need to seal off the light path from atmospheric fouling agents, may be severely detrimental to heat dissipation.

Heat dissipation restrictions may be addressed by employing distributed optical light concentration devices (lenses, reflectors) that are organized, for example, in a bi-dimensional array as the underlying array of photovoltaic cells. However, these alternative architectures often substantially weigh against deploying wavelengths splitters and lambda-specific photovoltaic cells. An extended bi-dimensional and multi-tier modularity generally complicates fabrication and assembly of distinct optically coupled functional components, requires numerous sun tracking actuators and related motorized structures, and has other drawbacks in terms of exposed area requirements, visual impact and impacts related to sensitivity from fouling of surfaces of optically coupled mirrors.

SUMMARY OF THE INVENTION

These conversion efficiency problems, drawbacks and architectural constraints of known solar light concentration photovoltaic cell systems are addressed by the architectural approach described herein.

A single solar light concentrator focuses the collected light onto a high transmittance termination of at least one multi-fiber optical cable, through which light is losslessly conveyed to a wavelength splitter, for example, a plurality of dichroic mirrors, for producing a plurality of light beams of different wavelength range.

Each light beam illuminates a high transmittance termination of one or more dedicated tap fibers adapted to losslessly transfer radiation energy of the wavelength spectrum of the specific beam. Therefore, from the wavelength splitter depart a number of lambda-dedicated, or wavelength-dedicated, optical fiber taps (individual fibers or groups of tap fibers) adapted to convey the radiation to remotely arranged photovoltaic cells that may be optimized for efficiently converting light energy of the specific wavelength spectrum carried along respective optical fiber taps into electrical energy.

Transfer of light energy to the wavelength splitter and from the splitter to lambda-specific photovoltaic cells through dedicated optical fibers permits placing the optical wavelength splitter and the photovoltaic cells as distant as needed from each other and from the solar light collecting and concentrating unit, and from the related supporting and orienting structure, for performing effective sun tracking during daylight.

Advantageously, the wavelength splitter and the photovoltaic cells optically coupled at the end of their respective fibers may conveniently be placed in weather protected areas easily reachable for inspection and periodical cleansing. And, in particular, the dissipative photovoltaic cells may be disposed in a way adapted such as to improve or optimize heat dissipation, for maintaining a high conversion efficiency even in periods of intense solar radiation and atmospheric heat.

BRIEF DESCRIPTION OF THE DRAWINGS

FIGS. 4(a)-(c) are schematic cross sections providing different views of the light trapping photovoltaic cell of the embodiment of FIG. 3, showing how the hollow cell structure may be constructed.

FIGS. 5(a)-(c) are schematic cross sections illustrating in different views, an alternative modified photovoltaic cell structure of the hollow light trapping photovoltaic cell structure of the embodiment of FIGS. 3 and 4(a)-(c).

FIGS. 7(a)-(c) are schematic cross sections illustrating another alternative embodiment of a light trapping photovoltaic cell structure of this invention, through a general view and enlarged detail views.

FIGS. 11, 12 and 13 are a cross section, perspective and end view, respectively, detailing the multilayer structure of the active photovoltaic cell with electrical connection contacts, according to the embodiment of FIGS. 7(a)-(c).

DETAILED DESCRIPTION OF THE PREFERRED EMBODIMENTS

Figure 1:
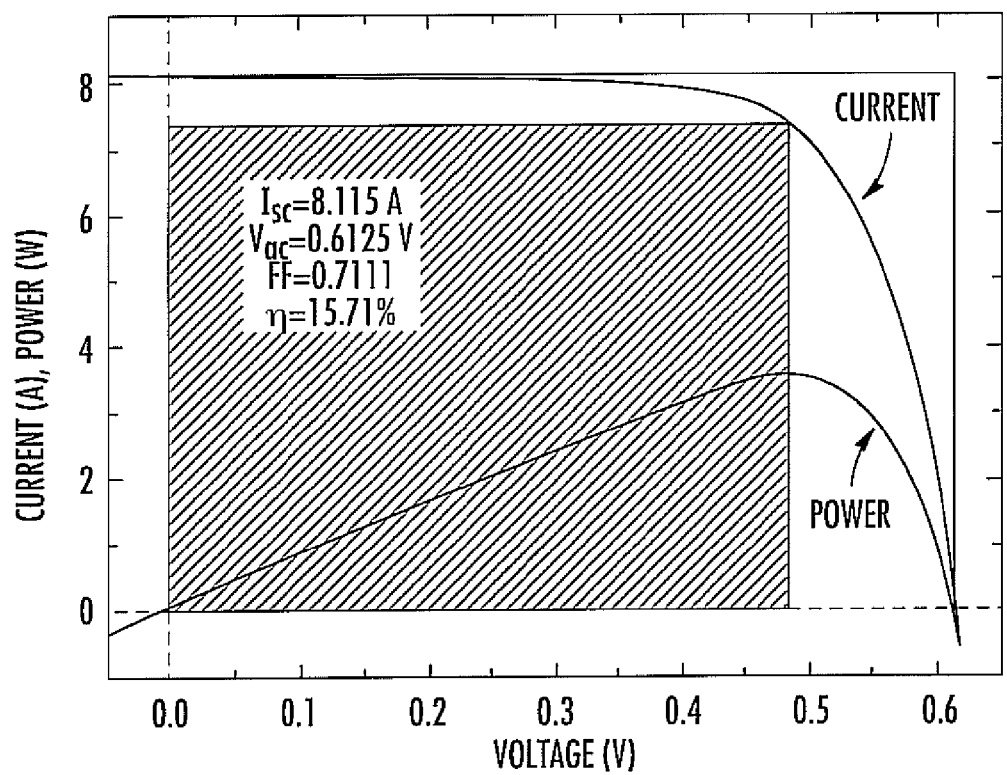
FIG. 1 shows typical I-V characteristics of a 15×15 cm crystalline silicon photovoltaic cell at STC as in the prior art.
Figure 2:
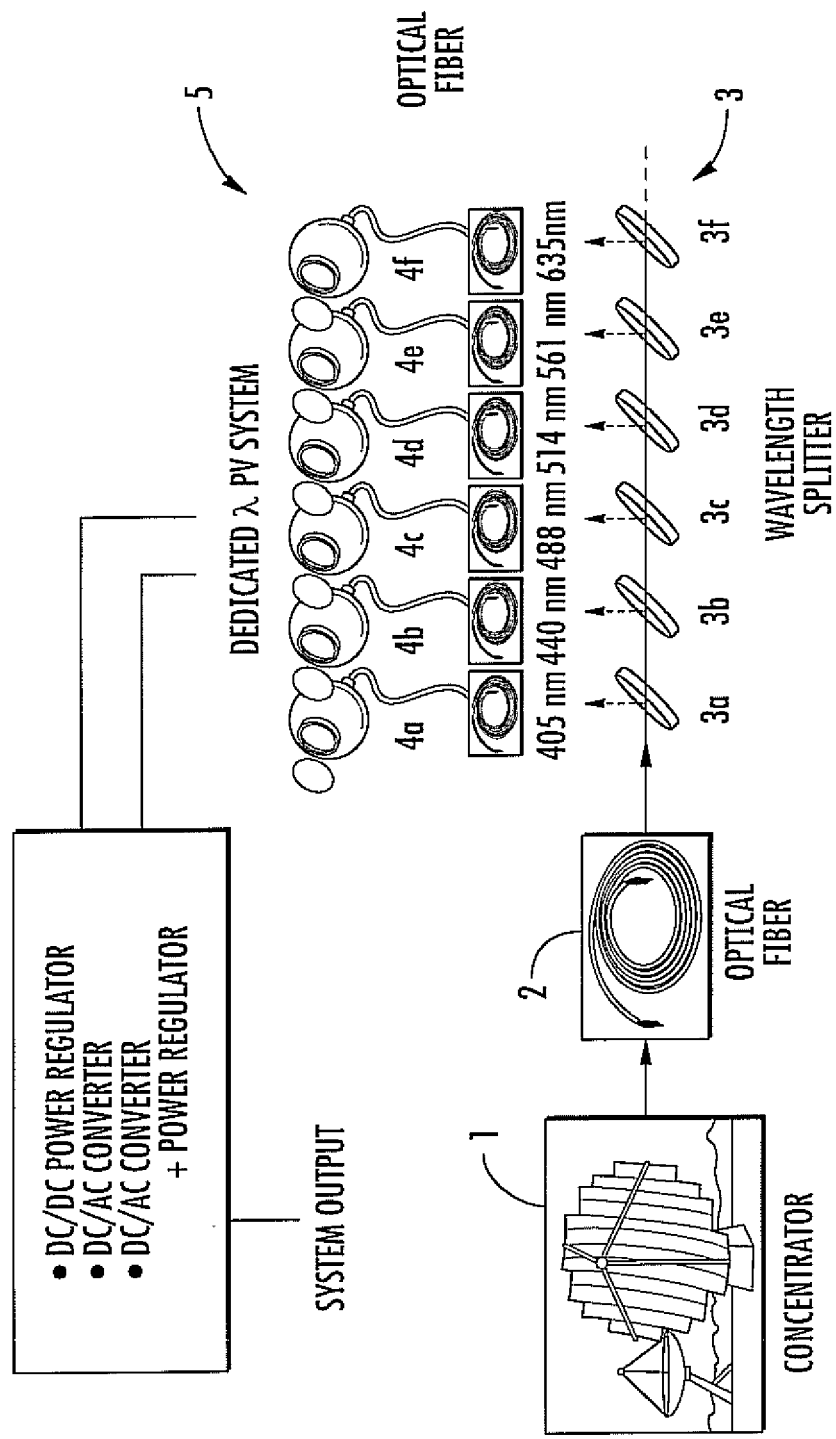
FIG. 2 is a schematic diagram of the general architecture of a photovoltaic conversion system according to the present invention.

FIG. 2 is a basic schematic illustration of the light concentration photovoltaic conversion system of the present disclosure.

Concentration of solar light is performed by a conventional sun-tracking convex mirror 1 mounted on a motorized support adapted to orient the mirror toward the sun during daylight. The mirror 1 focuses the gathered light onto a high transmittance termination of a multi-fiber cable 2 having a rated light transmission power capability adapted to the size of the mirror and maximum radiation intensity contemplated for the installation site.

At the other end, the multi-fiber cable 2 couples, through a high transmittance means or termination, to a common wavelength splitter 3 including a plurality of dichroic mirrors adapted to reflect light having a definite range of wavelengths, different from the other dichroic mirrors. The wavelength splitter 3 produces a plurality of split light beams each illuminating a high transmittance termination of one or of a number of lambda-dedicated (wavelength-dedicated) optical fibers 4a, 4b, . . . , 4f. Of course, the single lambda-dedicated or plurality of lambda-dedicated fibers of each of the light energy output taps of the splitter 3 have light power transmission capabilities commensurate with the contemplated maximum energy input to the system.

The end of each lambda-dedicated tap fiber or multi-fiber cable 4a, . . . , 4f, is optically coupled to a lambda-specific photovoltaic cell 5 associated to and physically supported by a light trapping structure, such as to effectively absorb substantially all of the incoming light energy and convert it into electricity.

Electrical connection terminals of each lambda-specific cell 5 are commonly connected, according to a design series-parallel scheme, to the input of common self-regulating electrical converting means or converter, adapted to output AC power at standard mains voltage and frequency.

According to this disclosure, the photovoltaic cell that is optically coupled to the end of each optical fiber tap, may be implemented in innumerable shapes and functional structures all adapted to effectively trap and absorb substantially all incoming light, through multiple reflections at least many of them occurring on the front surface of a common multilayer photovoltaic cell. In addition, the absorption layer of the photovoltaic cell is made of a lambda-specific material, adapted to efficiently convert into electricity incoming light of specific wavelength range transmitted through the lambda-dedicated fiber or multi-fiber cable.

Figure 3:
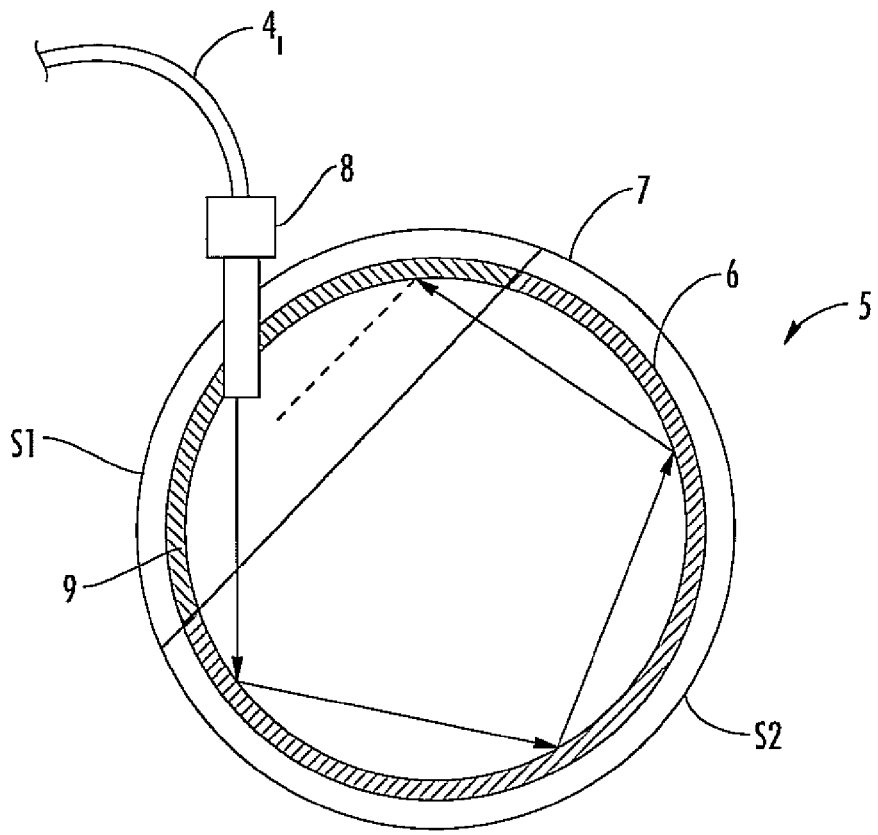
FIG. 3 is a schematic cross section illustrating the structure of a light trapping photovoltaic cell according to first embodiment of the invention.

FIG. 3 is a general illustration of a first embodiment of photovoltaic cell structure of this disclosure, characterized in that the multilayer active photovoltaic cell is formed onto (and supported on) the inner spherical surface of a hollow spherical support S1, S2, the wall of which is sealingly pierced by a high transmittance single fiber or multifiber termination 8, adapted to inject light into the hollow inner space which, in large measure, is defined by the front, light input side of the multilayered photovoltaic cell stack 6, the remaining portion of the confinement spherical surface having a highly reflective coating 9. The incoming light is trapped inside the hollow sphere and is eventually absorbed and converted in the active region of the multilayer photovoltaic cell stack 6 into electricity. Of course, the back side of the multilayered photovoltaic cell stack 6, directly supported on the inner surface of the spherical supporting cup S2, may comprise a metallization layer defining the cathode terminal of the cell and thus being opaque to light transmission and reflective. Therefore, reflectivity of inner surface of the spherical cap portion with the highly reflective coating 9 and of the remaining inner surface covered by the multilayered photovoltaic cell structure 6, effectively trap the injected light.

The spherical shell support 7 may be of glass and include two parts, S1 and S2, the first, through which the fiber termination 8 enters the hollow spherical space, has the highly reflecting inner coating 9, and the second S2 serves as solid substrate for deposition of the various layers making up the active photovoltaic cell stack 6 that may be deposited using common techniques of formation of active planar structures.

Such a composite structure of the photovoltaic cell of this disclosure may be better observed in the three views of FIGS. 4(a)-(c), wherein a) is a perspective view of the inner mirror surface of the spherical cap S1, b) replicates the cross section view of FIG. 3, and c) is a perspective view of the spherical cup S2, on the inner surface of which is formed the active PV cell stack 6.

Once the formation of the highly reflective inner surface of the spherical cap S1, fitted with the optical fiber termination 8, and of the active PV cell stack 6 onto the inner surface of the spherical cup S2 is completed, the two parts S1 and S2 may be permanently or semi-permanently joined, for example using a hot-melt glue or other equivalent sealing adhesive.

An alternative embodiment of photovoltaic cell structure of the disclosure is depicted in FIGS. 5(a)-(c).

Differently from the embodiment of FIGS. 3 and 4(a)-(c), wherein the optical fiber termination 8 enters the hollow sphere in a secant direction, in the modified embodiment of FIGS. 5(a)-(c) the optical fiber termination 8 enters the hollow sphere in a substantially radial direction such that the incoming light beam impinges onto a reflective convex surface 9c of a spherical cap portion S1 of the supporting hollow spherical body 7, locally coated with a high reflective metallic layer 9. The convex light spreading mirror surface 9c reflects the incident light into a flared-out beam that illuminates a large area of the surface of the multilayer photovoltaic cell stack 6, whereby, through multiple secondary reflections, light is eventually absorbed and converted into electricity.

Similarly to FIGS. 4(a)-(c), FIGS. 5(a)-(c) provide three views, of which a) is a perspective view of the inner mirror surface of the spherical cap S1, b) replicates the cross section view of FIG. 3, and c) is a perspective view of the spherical cup S2, on the inner surface of which is formed the active PV cell stack 6.

Figures 6A, 6B:
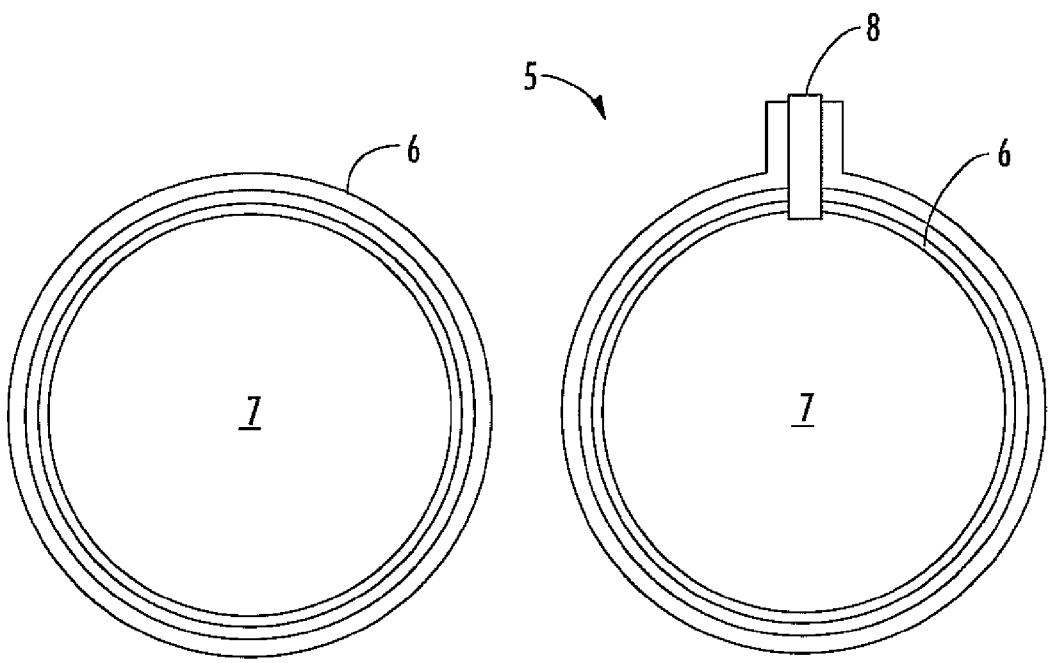
FIGS. 6(a)-(b) are schematic cross sections illustrating an alternative embodiment of a light trapping photovoltaic cell structure according to the invention.

FIGS. 6(a)-(b) illustrate an alternative embodiment of a lambda-specific light trapping photovoltaic cell structure of this disclosure, characterized in that the active photovoltaic cell stack is formed over the outer surface of a spherical solid body 7 of an optically transparent material, such as an optical glass.

Over the external surface of the spherical solid body 7, to which an optical fiber termination may be fused on or otherwise optically coupled, a PV cell stack is formed through successive deposition steps and patterning steps for defining the connection panel contacts and the functional multilayer stack of the photovoltaic cell 6. Of course, according to this alternative embodiment, over the outer surface of the optically transparent spherical body 7, the first layer deposited is a transparent conductive oxide (TCO) layer that, alike in the cell stacks of any other embodiment, forms the transparent conductive anode terminal of the cell over the light input front of the active cell stack.

The functional structure of a photovoltaic cell stack 6 includes an outer metallic multilayer defining the cathode terminal of the photovoltaic cell. Of course, common outer passivation layers finally coat the completed cell structure, permanently coupled to the lambda-dedicated fiber or multi-fiber cable.

According to an alternative embodiment shown in FIGS. 7(a)-(c), the light trapping structure is in the form of a truncated cone lens of optically transparent material, typically of optical glass or optical organic material, having its narrow base optically coupled to the end termination of a lambda-dedicated tap fiber or multi-fiber cable, the end of which may be permanently fused to the lens. The outer surface of the conical lens 7 is provided with a continuous highly reflective metal coating in order to prevent escape of light injected into the lens body.

The active multilayer photovoltaic cell stack is formed over the outer surface of the broad base of the lens, as illustrated schematically in the general view of FIG. 7(a).

In order to enhance local light trapping and absorption of the incident light by the material of the active absorption layer of the photovoltaic cell stack, the surface of the broad planar base of the conical lens body 7, acting as substrate of the photovoltaic cell stack formed thereon, has a textured surface, typically with closely spaced parallel shallow trenches, over the whole surface of which extends the photovoltaic cell stack, formed thereon by using deposition techniques specifically adapted to form highly conformal layers on the textured surface of the substrate.

Of course, whichever the embodiment, the light-input front TCO layer of the photovoltaic cell stack, defining the anode of the photodiode, is electrically contacted through one or several contacts formed at regularly spaced positions over the spherical, conical or planar surface, whether directly exposed to an inner hollow of the light trapping structure or deposited over the outer spherical surface of a transparent solid sphere or truncated cone lens body, optically coupled to the end of a lambda-dedicated fiber or multi-fiber cable.

Figure 8:
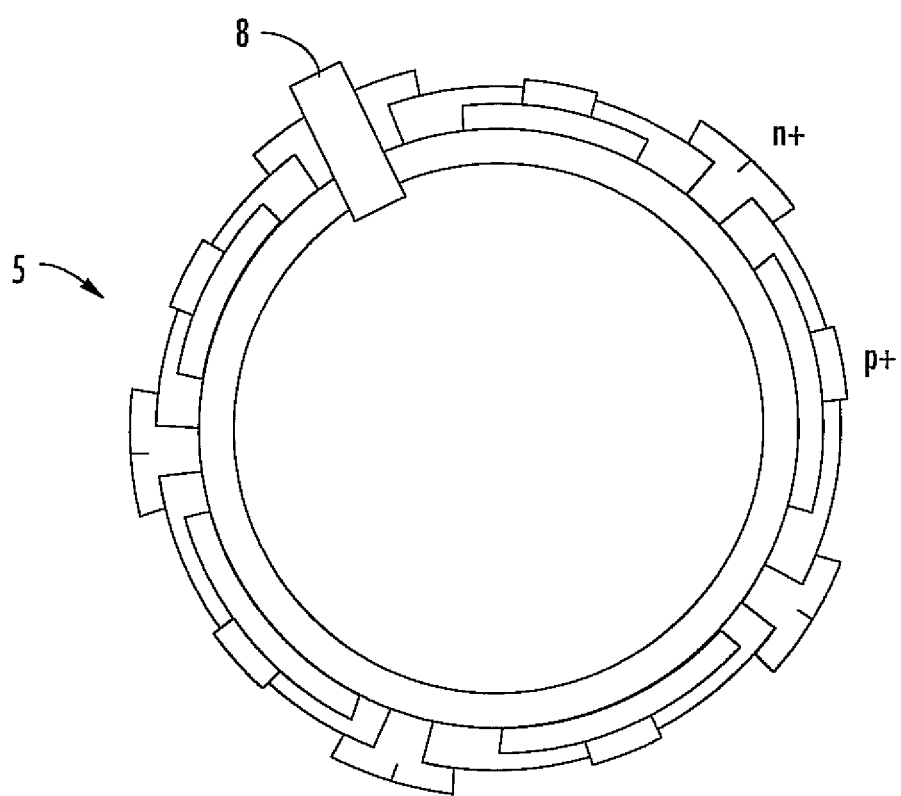
FIGS. 8, 9 and 10 are a cross section, a partial cross section, and a layout view, respectively, detailing the multilayer structure of the active photovoltaic cell with electrical connection contacts formed over a spherical support in accordance with the invention.
Figure 9:
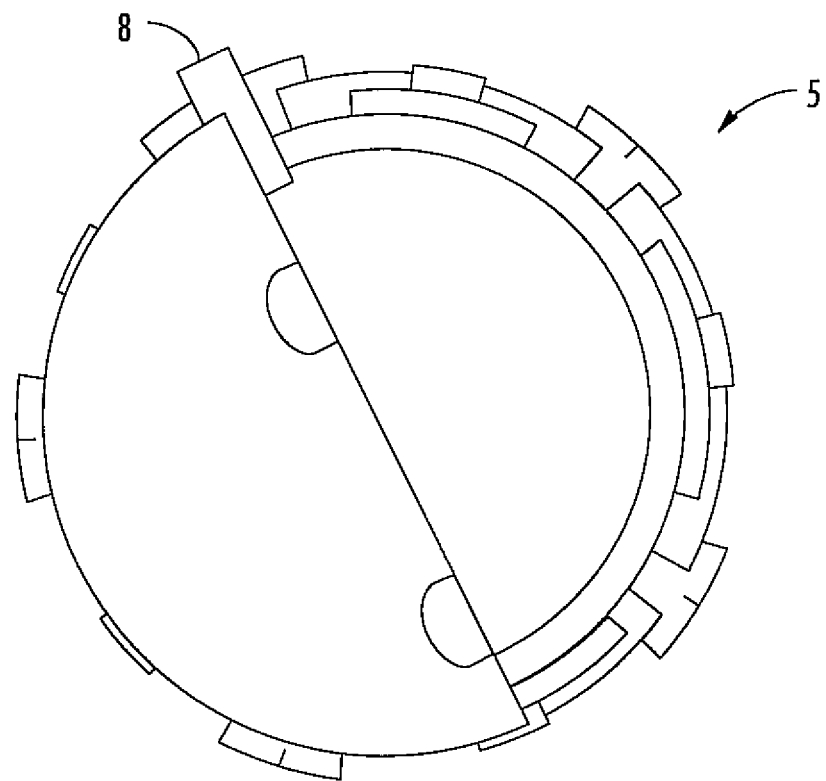
Figure 10:
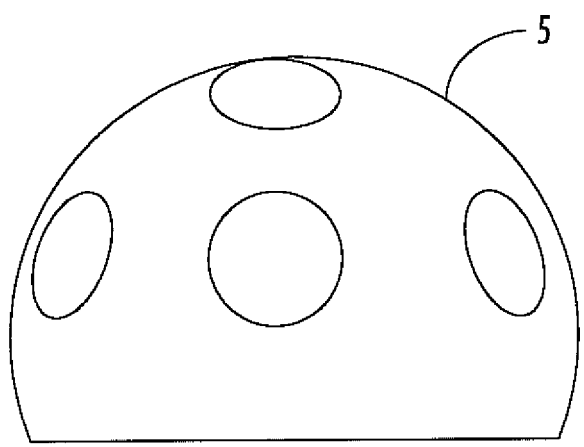

FIGS. 8, 9 and 10 are respectively a full cross sectional view, a partially cross sectional view and a layout view of a lambda-specific photovoltaic cell structure coupled to a respective lambda-dedicated optical fiber or multi-fiber cable, according to the embodiments described in connection with FIGS. 3, 4(a)-(c), 5(a)-(c) and 6. FIGS. 11, 12 and 13 are respectively a general cross sectional view, a layout view of anode contact p+ and a three-dimensional view illustrating the general disposition of the positive and negative terminals of the cell described in connection to the embodiment of FIG. 7.

These detailed views schematically show possible organizations of the spaced replicated electrical connection contacts n+, p+ from which the photovoltaic current generated by the lambda-specific cell can be conveyed to an input of a DC-DC or DC-AC conversion apparatus of the system.

That which is claimed is:

1. A solar light photovoltaic conversion system comprising:
   at least one multi-fiber cable;
   at least one solar light collector configured to focus collected light to said at least one multi-fiber cable;
   a plurality of optical fiber taps;
   a wavelength splitter coupled between said at least one multi-fiber cable and said plurality of optical fiber taps;
   a respective light spreading structure coupled to each of said plurality of optical fiber taps;
   wherein each of said light spreading structures comprises a hollow spherical light trapping body comprising a spherical shell support having an inner surface,
   the spherical shell support consists of a first portion and a second portion,
   the first portion contains one of the plurality of optical fiber taps and has a concave, reflective coating that directly contacts and is conformal to the entire inner surface of the first portion of the spherical shell support,
   the second portion has a concave, wavelength-specific photovoltaic cell that directly contacts and is conformal to the entire inner surface of the second portion of the spherical shell support;
   and electrical interconnections coupled to said wavelength-specific photovoltaic cell of each light spreading structure.

2. A solar light photovoltaic conversion system comprising:
   a wavelength splitter;
   a plurality of optical fiber taps coupled to said wavelength splitter;
   a respective light spreading structure coupled to each of said plurality of optical fiber taps; and
   wherein each of said light spreading structures comprises a hollow spherical light trapping body comprising a spherical shell support having an inner surface,
   the spherical shell support consists of a first portion and a second portion,
   the first portion contains one of the plurality of optical fiber taps and has a concave, reflective coating that directly contacts and is conformal to the entire inner surface of the first portion of the spherical shell support,
   the second portion has a concave, wavelength-specific photovoltaic cell that directly contacts and is conformal to the entire inner surface of the second portion of the spherical shell support.

3. A photovoltaic cell module to be coupled to an optical fiber tap comprising:
   a light spreading structure configured to be coupled to the optical fiber tap;
   wherein said light spreading structure comprises a hollow spherical light trapping body comprising a spherical shell support having an inner surface,
   the spherical shell support consists of a first portion and a second portion,
   the first portion contains the optical fiber tap and has a concave, reflective coating that directly contacts and is conformal to the entire inner surface of the first portion of the spherical shell support, the second portion has a concave, wavelength-specific photovoltaic cell that directly contacts and is conformal to the entire inner surface of the second portion of the spherical shell support;

and the wavelength-specific photovoltaic cell having a concave light-receiving front surface and having a reflective convex back surface.

4. A method for making a solar light photovoltaic conversion system comprising:

coupling a plurality of optical fiber taps to a wavelength splitter; and coupling a respective photovoltaic cell module to each of the optical fiber taps, each photovoltaic cell module comprising a light spreading structure coupled to the optical fiber tap, and wherein each of said light spreading structures comprises a hollow spherical light trapping body comprising a spherical shell support having an inner surface, the spherical shell support consists of a first portion and a second portion, the first portion contains one of the plurality of optical fiber taps and has a concave, reflective coating that directly contacts and is conformal to the entire inner surface of the first portion of the spherical shell support, the second portion has a concave, wavelength-specific photovoltaic cell that directly contacts and is conformal to the entire inner surface of the second portion of the spherical shell support.

\* \* \* \* \*